United States Patent
Huang et al.

(10) Patent No.: US 7,466,581 B2
(45) Date of Patent: Dec. 16, 2008

(54) SRAM DESIGN WITH SEPARATED VSS

(75) Inventors: Huai-Ying Huang, Jhonghe (TW);
Yen-Huei Chen, Hsin-Chu (TW);
Jui-Jen Wu, Hsin-Chu (TW); Ping-Wei Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/713,280

(22) Filed: Mar. 2, 2007

(65) Prior Publication Data

US 2008/0212353 A1    Sep. 4, 2008

(51) Int. Cl.
*G11C 11/00* (2006.01)

(52) U.S. Cl. ...................... 365/154; 365/226

(58) Field of Classification Search ................ 365/154, 365/226
See application file for complete search history.

(56) References Cited

U.S. PATENT DOCUMENTS

| | | | |
|---|---|---|---|
| 6,417,032 B1 | 7/2002 | Liaw | |
| 6,569,723 B2 | 5/2003 | Liaw | |
| 6,985,380 B2 | 1/2006 | Khellah et al. | |
| 2005/0146913 A1* | 7/2005 | Madan | 365/145 |
| 2007/0025162 A1* | 2/2007 | Deng et al. | 365/189.09 |
| 2007/0076467 A1* | 4/2007 | Yamaoka et al. | 365/154 |
| 2008/0031045 A1* | 2/2008 | Liaw | 365/185.07 |

OTHER PUBLICATIONS

Zhang, K., et al., A 3-GHZ 70-Mb SRAM in 65-nm CMOS Technology With Integrated Column-Based Dynamic Power Supply, IEEE Journal of Solid-State Circuits, Jan. 2006, pp. 146-151, vol. 41, No. 1, IEEE.

* cited by examiner

*Primary Examiner*—Michael T Tran
(74) *Attorney, Agent, or Firm*—Slater & Matsil, L.L.P.

(57) ABSTRACT

An array of static random access memory (SRAM) cells arranged in a plurality of rows and a plurality of columns includes a plurality of VSS lines connected to VSS nodes of the SRAM cells, with each VSS line connected to the SRAM cells in a same column. The plurality of VSS lines includes a first VSS line connected to a first column of the SRAM cells; and a second VSS line connected to a second column of the SRAM cells, wherein the first and the second VSS lines are disconnected from each other.

13 Claims, 3 Drawing Sheets

SRAM DESIGN WITH SEPARATED VSS

TECHNICAL FIELD

This invention relates generally to semiconductor devices, and more particularly to memory arrays, and even more particularly to design and manufacturing methods of arrays having static random access memory cells.

BACKGROUND

Static random access memory (SRAM) is commonly used in integrated circuits. SRAM cells have the advantageous feature of holding data without a need for refreshing. SRAM cells may include different numbers of transistors, and are often accordingly referred to by the number of transistors, for example, six-transistor (6T) SRAM, eight-transistor (8T) SRAM, and the like. The transistors typically form a data latch for storing a bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line, which is used for storing a bit into the SRAM cell or read from the SRAM cell.

With the scaling of integrated circuits, the operation voltages of integrated circuits are reduced, along with the operation voltages of memory circuits. Accordingly, read and write margins of the SRAM cells, which measure how reliably the bits of the SRAM cells can be read from and written into, respectively, are reduced. Due to the existence of static noise, the reduced read and write margins may cause errors in the respective read and write operations. Conventionally, to improve the read and write margins, dynamic powers are provided, which means different power supply voltages VDD are provided for read and write operations. For example, the write margin can be improved by reducing the power supply voltage VDD during the write operations, while the read margin can be improved by increasing the power supply voltage VDD during the read operations. However, such a solution suffers drawbacks. The performance of the arrays is compromised due to the delay resulted from generating the dual power. In addition, complicated circuits have to be designed to provide dynamic power, which circuits occupy the chip space.

Accordingly, new SRAM arrays having improved read and write margins while at the same time overcoming the deficiency of the prior art are needed.

SUMMARY OF THE INVENTION

In accordance with one aspect of the present invention, an array of static random access memory (SRAM) cells arranged in a plurality of rows and a plurality of columns includes a plurality of VSS lines connected to VSS nodes of the SRAM cells, with each VSS line connected to the SRAM cells in a same column. The plurality of VSS lines includes a first VSS line connected to a first column of the SRAM cells; and a second VSS line connected to a second column of the SRAM cells, wherein the first and the second VSS lines are disconnected from each other.

In accordance with another aspect of the present invention, an array of SRAM cells arranged in a plurality of rows and a plurality of columns includes a plurality of VSS lines connected to VSS nodes of the SRAM cells, with each VSS line connected to SRAM cells in a same column, wherein the plurality of VSS lines are disconnected from each other.

In accordance with yet another aspect of the present invention, an integrated circuit structure includes an array of SRAM cells arranged in a plurality of rows and a plurality of columns, wherein the array includes a plurality of VSS lines connected to VSS nodes of the SRAM cells, with each VSS line connected to the SRAM cells in a same column, wherein the plurality of VSS lines comprises a first VSS line connected to a first column of the SRAM cells. The array further includes a power circuit having a first output connected to the first VSS line, wherein the power circuit is adapted to providing different VSS voltages to the first VSS line.

In accordance with yet another aspect of the present invention, a method of operating an SRAM array includes providing the array comprising SRAM cells arranged in a plurality of rows and a plurality of columns. The array includes a plurality of VSS lines connected to VSS nodes of the SRAM cells, with each VSS line connected to the SRAM cells in a same column. The plurality of VSS lines includes a first VSS line connected to a first column of the SRAM cells; and a second VSS line connected to a second column of the SRAM cells, wherein the first and the second VSS lines are disconnected from each other. The method further includes providing a first voltage to the first VSS line; and providing a second voltage different from the first voltage to the second VSS line.

In accordance with yet another aspect of the present invention, a method of operating an SRAM array includes providing the array comprising SRAM cells arranged in a plurality of rows and a plurality of columns, wherein the array comprises a plurality of VSS lines connected to VSS nodes of the SRAM cells with each VSS line connected to SRAM cells in a same column, wherein the plurality of VSS lines comprises a first VSS line connected to a first column of the SRAM cells. The method further includes providing a first voltage to the first VSS line; and providing a second voltage different from the first voltage to the first VSS line.

By providing variable voltages to VSS lines of the SRAM arrays, read and write margins are improved.

DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
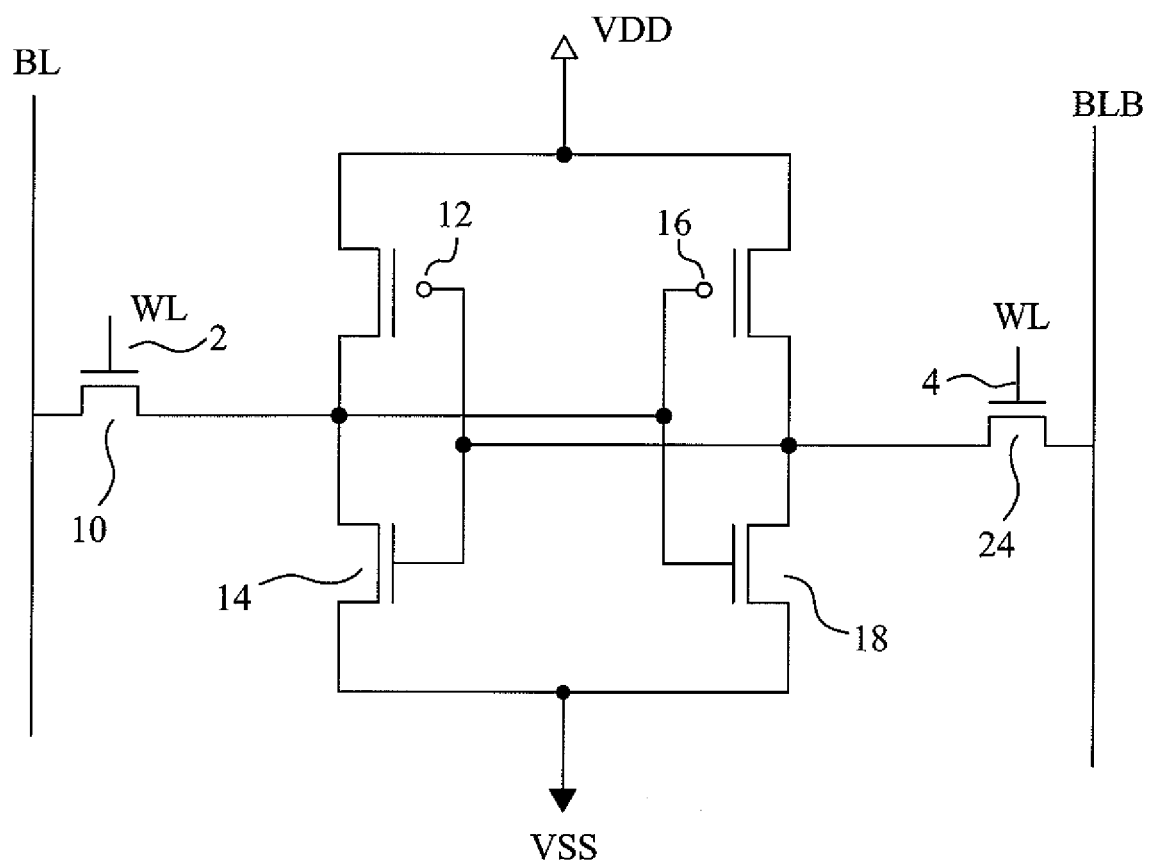
FIG. 1 illustrates a conventional six-transistor static random access memory cell.

FIG. 1 illustrates an exemplary circuit diagram of a typical six-transistor (6T) static random access memory (SRAM) cell, which includes pass-gate metal-oxide-semiconductor (MOS) devices (also referred to as transistors) 10 and 24, pull-up MOS devices 12 and 16, and pull-down MOS devices 14 and 18. Gates 2 and 4 of the respective pass-gate MOS devices 10 and 24 are controlled by a word-line WL that determines whether the current SRAM cell is selected. A latch formed of pull-up MOS devices 12 and 16 and pull-down MOS devices 14 and 18 stores a bit. The stored bit can be read through bit lines BL and BLB. Voltage nodes VDD and VSS provide the power needed for the operation of the SRAM cell. As is known in the art, the voltage at node VDD is higher than the voltage at node VSS.

Figure 2:
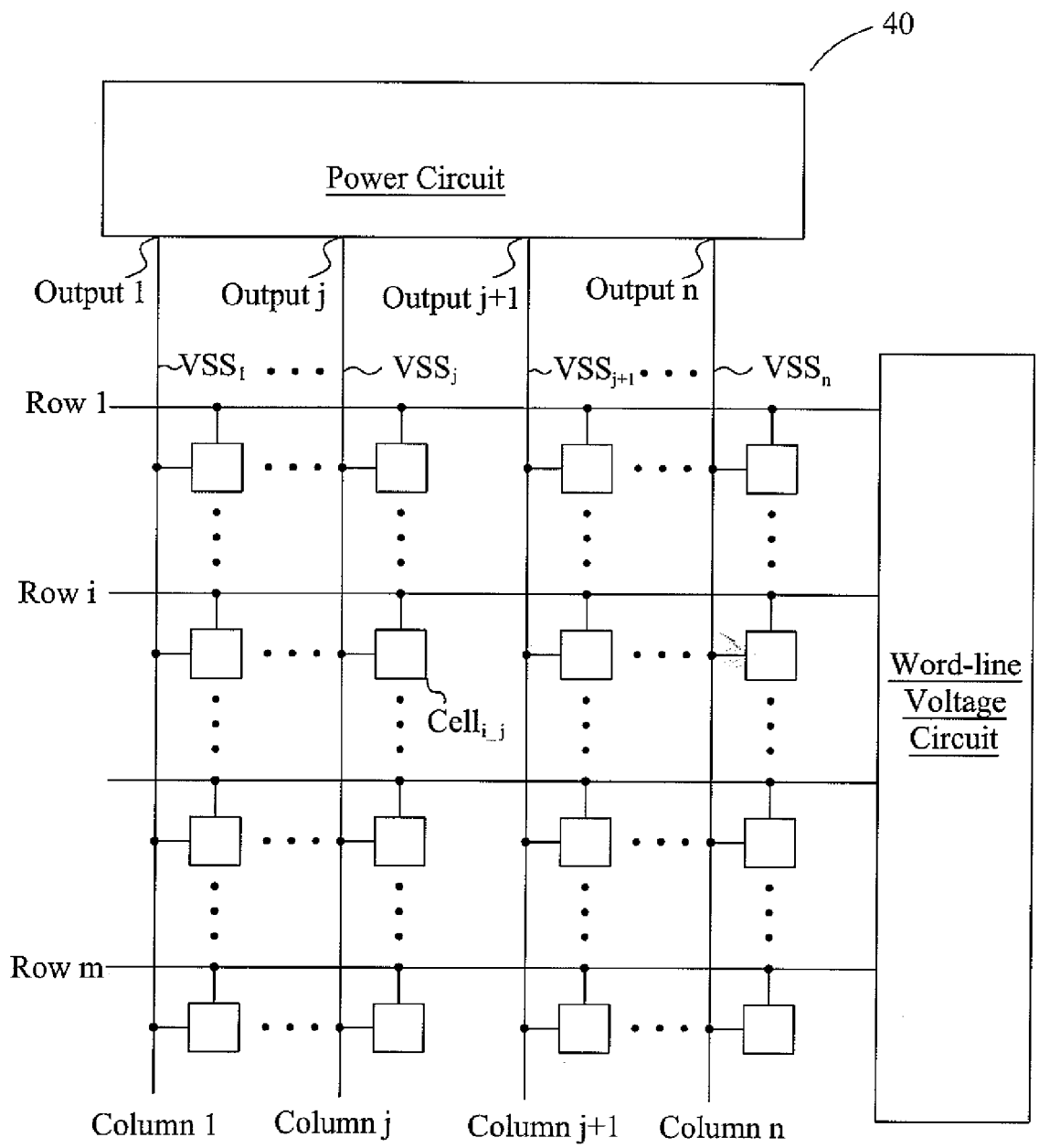
FIGS. 2 and 3 illustrate embodiments of the present invention, wherein in static random access memory (SRAM) arrays, VSS lines connected to VSS nodes of SRAM cells are disconnected from each other.

FIG. 2 illustrates an embodiment of the present invention, which includes an SRAM array 40 having a plurality of SRAM cells arranged in a plurality of rows and columns. Each of the SRAM cells, which are symbolized by squares, may have the structure as shown in FIG. 1, or another commonly used SRAM cell structure, for example, with a different number of MOS devices. For discussion purposes, assume SRAM array 40 includes m rows numbered from row 1 through row m, and n columns numbered from column 1 through column n. Therefore, there are total m*n SRAM cells. Throughout the description, if an SRAM cell is selected to be read from or written into, the SRAM cell is referred to as a selected SRAM cell, the corresponding row and column of the selected SRAM cell are referred to as a selected row and a selected column, respectively.

SRAM cell 40 further includes a plurality of bit-lines BL and BLB (refer to FIG. 1), which are laid out in column direction. Further, each column has a VDD line connected to the VDD node of each of the SRAM cells. For simplicity, bit-lines BL, BLB, and VDD lines that are connected to the SRAM cell are not shown in FIG. 2.

Each row of the SRAM cells is connected to one of the word-lines denoted as $WL_1$ through $WL_m$, which are connected to a word-line voltage circuit. The word-line voltage circuit provides word-line voltages to the word-lines. Additionally, it has the ability to adjust the voltage supplied to each word-line based on whether a row is selected or not. For example, if a selected SRAM cell is being read from or written into, a word-line voltage, which is suppressed, or in other words, reduced compared to regular voltage VDD, is supplied to the word-line connected to the selected SRAM cell. Word-lines of unselected rows may be applied with 0V. Alternatively, the word-line connected to the selected SRAM cell may be provided with regular VDD, which the same as the voltage provided to the VDD nodes of the SRAM cells.

The VSS nodes of the SRAM cells in a same column are connected to a same VSS line. Therefore, there are n VSS lines denoted as $VSS_1$ through $VSS_n$. In an embodiment, each of the VSS lines $VSS_1$ through $VSS_n$ are disconnected from other VSS lines. A power circuit provides required VSS voltages for operating the SRAM cells. The power circuit preferably has a plurality of outputs denoted as output 1 through output n, each being connected to one of the VSS lines $VSS_1$ through $VSS_n$. Throughout the description, the VSS line connected to the selected cell is referred to as the selected VSS line, and the word-line connected to the selected cell is referred to as the selected word-line.

The read and write operations of the SRAM cells are explained as follows. It is assumed that the read and write operations are performed to a selected SRAM cell $cell_{i\_j}$, wherein i is the row number, and j is the column number. In the preferred embodiment, during the read and write operations, the VDD voltages applied to the SRAM cells are kept constant. Alternatively, VDD voltages connected to each column of SRAM cells can be dynamic to improve read and write margins, although such a scheme will incur higher cost in chip area and sacrifice in performance.

In the read operation of the selected SRAM cell $cell_{i\_j}$, the selected VSS line $VSS_j$ is applied with a negative voltage VSS_1. In an exemplary embodiment, the absolute value of the negative voltage VSS_1 is between about −50 mv if VDD is about 0.8V and about −100 mv if VDD is about 1.5V. With a negative voltage VSS_1, the voltage spread applied on the selected SRAM cell $cell_{i\_j}$, which equals (VDD−VSS_1), is increased over conventional voltage spread, which is VDD. This has a same effect as increasing voltage VDD. As a result, the read margin is improved.

While the selected row is applied with a negative VSS during the read operation of the selected cell $cell_{i\_j}$, unselected VSS lines are preferably connected to GND to avoid dummy read disturbance.

In the write operation of the selected SRAM cell $cell_{i\_j}$, the selected VSS line $VSS_j$ is applied with a positive voltage VSS_3. In an exemplary embodiment, the positive voltage VSS_3 is preferably between about 200 mv if VDD is about 0.8V and about 450 mv if VDD is about 1.5V. With a positive voltage VSS_3, the voltage spread between voltages VDD and VSS_3 is reduced, which has a same effect as reducing voltage VDD. As a result, the write margin is improved.

While the selected row is applied with a positive VSS_3 during the write operation of the selected SRAM cell $cell_{i\_j}$. Unselected VSS lines are preferably connect to GND to avoid dummy read disturbance.

At standby mode, wherein no read or write operations are performed to SRAM cells, VSS lines $VSS_1$ through $VSS_n$ may be connected to a positive voltage, which may have a value essentially the same as the voltage VSS_2. Alternatively, VSS lines $VSS_1$ through $VSS_n$ may be grounded, and hence are at 0V.

Figure 3:
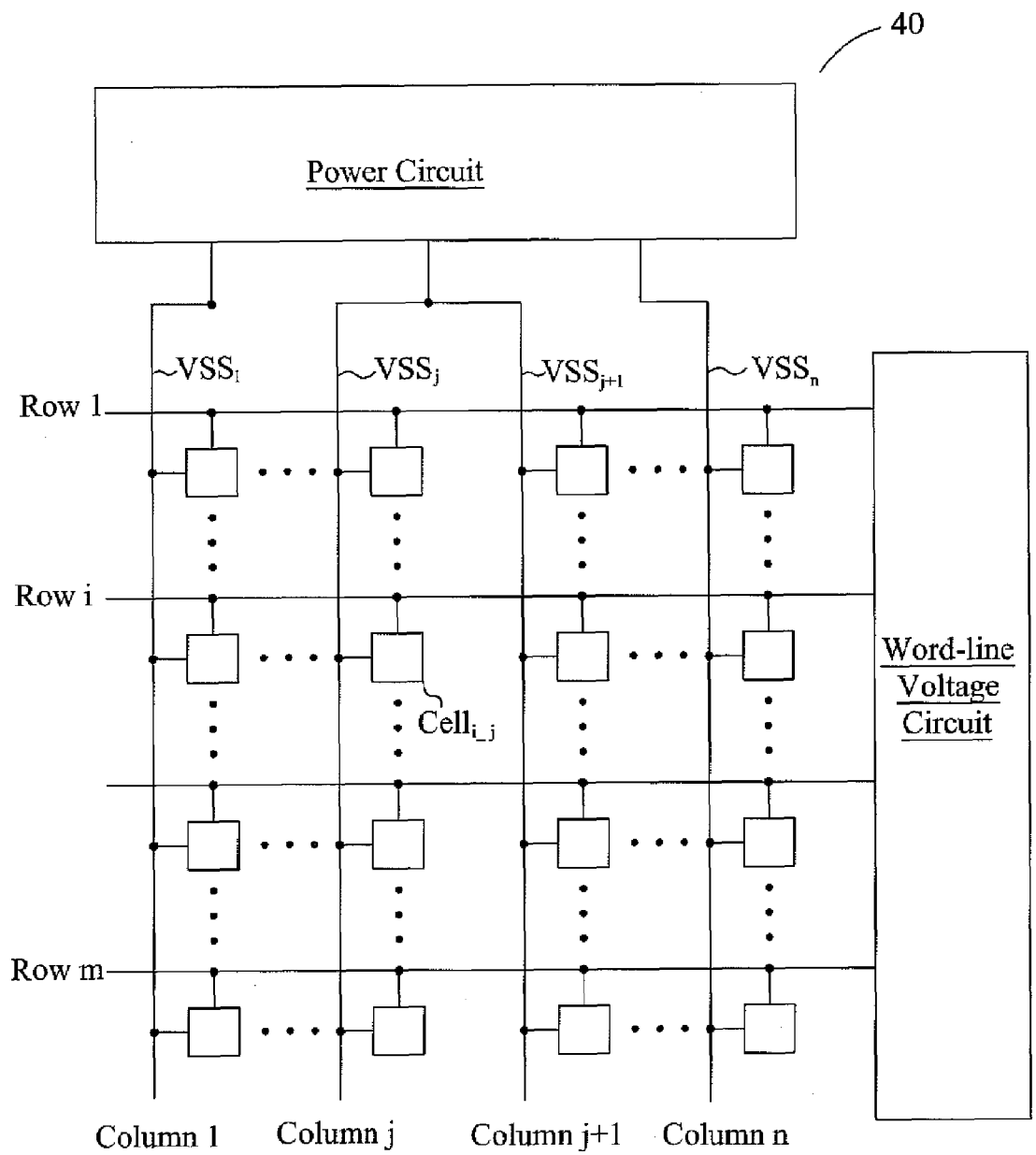

A second embodiment of the present invention is shown in FIG. 3. This embodiment is similar to the embodiment shown in FIG. 2, except that the VSS lines are grouped, and each group of the VSS lines are applied with a same VSS voltage. For example, VSS lines $VSS_j$ and $VSS_{j+1}$ are interconnected. During a read operation of any SRAM cell in columns j or j+1, the corresponding VSS line $VSS_j$ and $VSS_{j+1}$ are connected to the negative voltage VSS_1, while VSS lines connected to remaining columns of the SRAM cells are applied with the positive voltage VSS_2, or alternatively be grounded. During a write operation of any SRAM cell in columns j or j+1, the corresponding VSS lines $VSS_j$ and $VSS_{j+1}$ are connected to the positive voltage VSS_3, while VSS lines connected to the remaining columns of the SRAM cells are also applied with the positive voltage VSS_2, or alternatively be grounded.

In alternative embodiments, each group of the columns (whose VSS lines are connected) may include 4 columns, 8 columns, or other selected numbers of columns. The grouping of VSS lines may reduce the complexity of the design of the power circuit, since less individual lines need to be controlled. However, the benefit of reduced leakage is compromised. An optimum number in each group may be determined based on design requirements.

In yet other embodiments, all SRAM cells in SRAM array 40 are connected to a same VSS line, and thus the columns of VSS lines cannot have individual voltages. In this case, there is no benefit of reduced leakage currents from standby SRAM cells. However, the read margin and write margin can still be improved by applying a negative voltage VSS to the selected SRAM cell for read operations and applying a positive voltage VSS to the selected cells for write operations.

It is appreciated that negative voltage VSS_1 and positive voltage VSS_3 are only examples. In alternative embodiments of the present invention, each of the voltages VSS_1 and VSS_3 may be positive or negative, providing voltage VSS_3 is higher than voltage VSS_1.

The word-line voltage circuit may provide suppressed word-line voltages to the selected word-line. In the case SRAM cell $cell_{i\_j}$ is selected, word-line $WL_i$ has a value lower than VDD, while unselected word-lines are applied with zero volt. Such a scheme may help reduce leakage currents for SRAM cells in the same row as the selected cell $cell_{i\_j}$. However, the suppressed word-line voltage causes a decrease in the read and write speeds of the selected cell, $cell_{i\_j}$. An advantageous feature of the present invention is that the improved read and write margin improves the respective operation speed, at least partially compensating for the speed loss due to the suppressed word-line voltage.

A further advantageous feature of the embodiments of the present invention is that compared to prior art having dynamic VDD powers, the circuit for varying VSS voltages is simpler. For example, transistors may be used for reducing or increasing VSS by utilizing the voltage difference between a gate and a source of a transistor. Alternatively, charge pumps may be used for providing different VSS voltages. The power circuit thus takes up less chip area than in the case wherein dynamic VDD voltages are provided.

As is commonly known in the art, SRAM cells have many variations. For example, six-transistor (6T), 8-transistor (8T), 12-transistor (12T) and 14-transistor (14T) are commonly used SRAM structures. One skilled in the art will realize that the previously provided teaching is readily available for SRAM cells having different numbers of MOS devices.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An array of static random access memory (SRAM) cells arranged in a plurality of rows and a plurality of columns, wherein the array comprises:
   a plurality of VSS lines connected to VSS nodes of the SRAM cells, with each VSS line connected to the SRAM cells in a same column, wherein the plurality of VSS lines comprises:
      a first VSS line connected to a first column of the SRAM cells; and
      a second VSS line connected to a second column of the SRAM cells, wherein the first and the second VSS lines are disconnected from each other; and
   a power circuit comprising:
      a first output connected to the first VSS line; and
      a second output connected to the second VSS line, wherein the power circuit is configured to output a first voltage to the first output, and a second voltage to the second output, and wherein the first voltage is different from the second voltage.

2. The array of claim 1, wherein one of the first and the second voltages is about 0V, and a remaining one of the first and the second voltages is a negative voltage having a magnitude of less than about 100 mV.

3. The array of claim 1, wherein the power circuit is adapted to provide positive and negative voltages to each of the first and the second VSS lines.

4. The array of claim 1 further comprising a third VSS line connected to a third column of the SRAM cells, wherein the third VSS line is electrically connected to the first VSS line.

5. The array of claim 1 further comprising a plurality of word-lines connected to the SRAM cells, with each word-line connected to the SRAM cells in a same row, wherein the plurality of word-lines is connected to a word-line voltage circuit adapted to provide different voltages to different word-lines.

6. The array of claim 1, wherein all of the plurality of VSS lines are disconnected from each other.

7. An array of static random access memory (SRAM) cells arranged in a plurality of rows and a plurality of columns, wherein the array comprises:
   a plurality of VSS lines connected to VSS nodes of the SRAM cells, with each VSS line connected to SRAM cells in a same column, wherein the VSS lines are disconnected from each other; and
   a power circuit connected to the plurality of VSS lines, wherein the power circuit is configured to provide different voltages to each of the plurality of VSS lines.

8. The array of claim 7, wherein the power circuit is adapted to provide a positive or a negative voltage to each of the plurality of VSS lines.

9. The array of claim 7 further comprising a plurality of word-lines connected to the SRAM cells, with each word-line connected to the SRAM cells in a same row, wherein the plurality of word-lines is connected to a word-line voltage circuit adapted to provide different voltages to different word-lines.

10. An integrated circuit structure comprising:
    an array of static random access memory (SRAM) cells arranged in a plurality of rows and a plurality of columns, wherein the array comprises:
       a plurality of VSS lines connected to VSS nodes of the SRAM cells, with each VSS line connected to the SRAM cells in a same column, wherein the plurality of VSS lines comprises a first VSS line connected to a first column of the SRAM cells; and
    a power circuit having a first output connected to the first VSS line, wherein the power circuit is adapted to provide different VSS voltages to the first VSS line.

11. The integrated circuit structure of claim 10 further comprising a second VSS line connected to a second column of the SRAM cells, wherein the first and the second VSS lines are disconnected from each other, and wherein the power circuit is adapted to provide different voltages to the first and the second VSS lines.

12. The integrated circuit structure of claim 10, wherein the power circuit comprises a plurality of outputs, each being connected to one of the plurality of VSS lines.

13. The integrated circuit structure of claim 10, wherein the array further comprises a third VSS line connected to the first VSS line.

* * * * *